(12) United States Patent
Rong et al.

(10) Patent No.: US 10,516,424 B2
(45) Date of Patent: Dec. 24, 2019

(54) SIGNAL PROCESSING ARRANGEMENT FOR A TRANSMITTER

(71) Applicant: Huawei Technologies Co., Ltd., Shenzhen (CN)

(72) Inventors: Liang Rong, Kista (SE); Fuquan Zhang, Shanghai (CN); Jinming Wang, Shanghai (CN); Bingxin Li, Kista (SE); Chen Wang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/909,520

(22) Filed: Mar. 1, 2018

(65) Prior Publication Data

US 2018/0191387 A1 Jul. 5, 2018

Related U.S. Application Data

(63) Continuation of application No. PCT/CN2017/073503, filed on Feb. 14, 2017.

(30) Foreign Application Priority Data

Feb. 25, 2016 (EP) .................................... 16157408

(51) Int. Cl.
*H04B 1/00* (2006.01)
*H04B 1/04* (2006.01)
(Continued)

(52) U.S. Cl.
CPC ......... *H04B 1/0483* (2013.01); *H03F 1/3252* (2013.01); *H03F 3/195* (2013.01);
(Continued)

(58) Field of Classification Search
CPC ........ H03F 1/3252; H03F 3/195; H03F 3/211; H03F 3/245; H03F 2203/21142; H04B 1/02; H04B 1/0483
See application file for complete search history.

(56) References Cited

U.S. PATENT DOCUMENTS 5,838,210 A * 11/1998 Midya .................. H03C 1/06
332/109
6,594,309 B1 7/2003 Grosso et al.
(Continued)

FOREIGN PATENT DOCUMENTS

CN 103166652 A 6/2013
CN 104717165 A 6/2015
(Continued)

OTHER PUBLICATIONS

Ruotsalainen, H., et al., "A New Quadrature PWM Modulator With Tunable Center Frequency for Digital RF Transmitters," IEEE Transactions on Circuits and Systems II: Express Briefs, vol. 59, No. 11, Nov. 2012, pp. 756-760.
(Continued)

*Primary Examiner* — Dac V Ha
(74) *Attorney, Agent, or Firm* — Conley Rose, P.C.

(57) ABSTRACT

A signal processing arrangement for a transmitter includes an in-phase modulator configured to receive an in-phase signal (I) and configured to modulate the in-phase signal (I); a quadrature modulator configured to receive a quadrature signal (Q) and configured to modulate the quadrature signal (Q); an in-phase demodulator configured to demodulate the modulated in-phase signal (I) and to output a demodulated in-phase signal (I); a quadrature demodulator configured to demodulate the modulated quadrature signal (Q) and to output a demodulated quadrature signal (Q); an in-phase harmonic filter configured to perform a filtering on harmonics in the demodulated in-phase signal (I) and to output an
(Continued)

in-phase digital signal (I); and a quadrature harmonic filter configured to perform a filtering on harmonics in the demodulated quadrature signal (Q) and to output a quadrature digital signal (Q).

20 Claims, 3 Drawing Sheets (51) Int. Cl.
*H03F 1/32* (2006.01)
*H03F 3/195* (2006.01)
*H03F 3/21* (2006.01)
*H03F 3/24* (2006.01)

(52) U.S. Cl.
CPC ............. *H03F 3/211* (2013.01); *H03F 3/245* (2013.01); *H03F 2203/21106* (2013.01); *H03F 2203/21142* (2013.01)

(56) References Cited

U.S. PATENT DOCUMENTS

| | | | | |
|---|---|---|---|---|
| 8,223,885 | B2* | 7/2012 | Zhu | H04L 27/2089 375/295 |
| 9,167,185 | B2* | 10/2015 | Tomiyama | H04N 5/4401 |
| 9,621,387 | B1* | 4/2017 | Magers | H03C 3/40 |
| 2004/0005869 | A1 | 1/2004 | See et al. | |
| 2009/0149151 | A1 | 6/2009 | Bryant | |
| 2011/0043398 | A1 | 2/2011 | Hezar et al. | |
| 2013/0156089 | A1 | 6/2013 | Hezar et al. | |
| 2015/0071338 | A1* | 3/2015 | Talwalkar | H04L 27/36 375/238 |

FOREIGN PATENT DOCUMENTS

| | | |
|---|---|---|
| CN | 105099210 A | 11/2015 |
| EP | 2378669 A1 | 10/2011 |
| GB | 2456889 A | 8/2009 |

OTHER PUBLICATIONS

Silva, N., et al., "Evaluation of Pulse Modulators for All-Digital Agile Transmitters," IEEE MTT-S International Microwave Symposium, 2012, 3 pages.
Foreign Communication From a Counterpart Application, Korean Application No. 10-2017-7030309, Korean Office Action dated Oct. 12, 2018, 7 pages.
Foreign Communication From a Counterpart Application, Korean Application No. 10-2017-7030309, English Translation of Korean Office Action dated Oct. 12, 2018, 4 pages.
Machine Translation and Abstract of Chinese Publication No. CN104717165, Jun. 17, 2015, 11 pages.
Machine Translation and Abstract of Chinese Publication No. CN105099210, Nov. 25, 2015, 10 pages.
Foreign Communication From a Counterpart Application, European Application No. 16157408.2, Extended European Search Report dated Jul. 21, 2016, 7 pages.
Foreign Communication From a Counterpart Application, PCT Application No. PCT/CN2017/073503, English Translation of International Search Report dated May 2, 2017, 7 pages.
Foreign Communication From a Counterpart Application, PCT Application No. PCT/CN2017/073503, English Translation of Written Opinion dated May 2, 2017, 5 pages.

* cited by examiner

Fig. 6

SIGNAL PROCESSING ARRANGEMENT FOR A TRANSMITTER

CROSS-REFERENCE TO RELATED APPLICATIONS

This application is a continuation of International Application No. PCT/CN2017/073503, filed on Feb. 14, 2017, which claims priority to European Patent Application No. EP16157408.2, filed on Feb. 25, 2016, both of which are hereby incorporated by reference in their entireties.

FIELD OF THE INVENTION

The present disclosure relates to a signal processing arrangement for a transmitter. More specifically the present disclosure relates to a signal processing arrangement configured to perform a filtering on modulation harmonics in a digital RF transmitter.

BACKGROUND

In a traditional analog radio frequency (RF) transmitter, configured to receive a digital signal, the digital signal is converted into an analog signal in a digital-to-analog converter (DAC) before any other signal processing. The analog signal is then filtered, up-converted and amplified in a linear power amplifier. In the linear power amplifier, the small analog/RF linear signal from the digital-to-analog converter DAC is power enlarged to reach a required output power level. The amplified signal is then filtered to remove the bandwidth expansion caused by non-linearity in the power amplification. Finally, the amplified analog/RF signal is output to an antenna. In such a traditional analog/RF transmitter the digital contents of the signal no longer exist after the conversion in the DAC.

In recent years, digital transmitters (DTX) and digital power amplifiers (DPA) have undergone an extensive development with support from Complementary Metal Oxide Semiconductor (CMOS) technology. Due to CMOS process scaling, digital components can nowadays switch at a high frequency which even surpasses radio frequencies while still keeping the operating power low.

This trend provides the motivation to realize a DTX/DPA in a pure digital style. In a DTX/DPA architecture according to conventional technology the demand of using digital signal processing as much as possible removes the use of a DAC. The DAC is replaced by a digital up-sampling module to align the data flow bit rate with a digital carrier signal ($DF_{1o}$) later in the DTX/DPA. For the same reason the analog channel bandwidth filter, is also removed. To compensate for the digitized signal quantization noise problem, a noise shaping algorithm/module is mostly used to enhance the signal-to-noise performance and during this stage, different DPA modulation algorithms and different types of DPAs emerged. For example, some may use ADC sampling algorithm and others may use sigma-delta modulation (SDM) algorithm or pulse width modulation (PWM) algorithm, so these algorithms categorize the DTX/DPA into RF-DAC/RF-SDM/RF-PWM type DTX/DPA.

A DTX/DPA is a kind of transmitter architecture which implement, mostly digital switching blocks/modules for signal processing/modulation and switching PA as output stage to amplify output RF power. A DTX/DPA is different from traditional analog/RF transmitter because the internal signal flow is mostly on/off switching digital characteristics instead of continuous analog/RF signal.

After the noise shaping processing, the digital signal with multiple level representation needs to be further processed and mapped into a fully switching on/off ('0's or '1's) signal, here the digital demodulation module will be used. In this stage, the digital signal will finally be synchronized into bit rates for the digital carrier signal and is turned into a fully ones/zeros bit sequence. The demodulation method can match the previous modulation algorithm but it is also possible to use a combination of modulation techniques. As an example, SDM modulation may use ADC or PWM style demodulation methods.

With digitized high speed baseband data according to conventional technology, digital up-conversion and mixing may also be realized in digital style. For example, when '1010 . . . 10' represents 0 degree phase carrier signal, its complementary signal '0101 . . . 01' represents 180 degree negative phase signal. And with more bits combination, I channel and Q channel carrier frequency signal can be represented in digital bits. This greatly facilitates the RE digital up-conversion process as a simple 'AND' logic operation is sufficient. Since the digital RF I/Q carrier signal has a fixed pattern for every baseband modulation cycle, a batch process can help to reduce the processing clock frequency and parallel data bits are generated during this process.

In DTX/DPA architectures, according to conventional technology, a digital signal may be modulated into an in-phase signal and a quadrature signal. According to conventional technology SDM is used for noise shaping processing and PWM translation is used as digital demodulation for the in-phase signal and the quadrature signal, respectively. Connected to the digital demodulation modules are repeaters configured to data rate match the signal from PWM to the RF carrier signal. Connected to the repeaters is an interleaver module which realizes digital up-conversion and mixing. The mixed digital signal is then fed to a power amplifier (PA). The PA is connected to a load which is configured to radiate RF signal into the surrounding air. A problem with the DTX/DPA architectures according to conventional technology is that the power/hardware cost for the SDM module is high if the SDM module is to operate at a high processing speed. If the SDM operates at a low processing speed the out-of-band noise becomes high. A low processing speed for the SDM will cause lower noise suppression performance and due to the operation of the repeater the SDM modulation noise will fold back and increase the in-band noise level. Thus, the SDM actually does not contribute to the suppression of harmonics.

Another drawback with SDM is that the modulation harmonics are too high and that they are not possible to be attenuated to requested level even with an external filter. In some application scenarios, not only in-band noise level but also out-of-band noise level should be as low as possible. Thus, these high modulation harmonics, which are located at modulation frequency spaced locations, create problems in the described arrangements according to conventional technology.

Modulation harmonics are quite common for DTX/DPAs which use a different modulation processing frequency different from the carrier frequency. Thus, once the modulation frequency is too small, modulation harmonics will be quite close to the band-of-interest and then the system bandpass filter will be quite hard to attenuate.

SUMMARY

An objective of the present disclosure is to provide a signal processing arrangement for a transmitter, wherein the signal processing arrangement at least reduces the modulation harmonics problems.

A further objective of the present disclosure is to provide a signal processing arrangement for a transmitter, wherein the signal processing arrangement filters out modulation harmonics more efficiently than signal processing arrangements according to conventional technology.

The above objectives are fulfilled by the subject matter of the independent claims. Further advantageous implementation forms of the present disclosure can be found in the dependent claims.

In the following, an IQ data signal is to be understood as a data signal comprising an in-phase data signal or an I data signal and a quadrature data signal or a Q data signal.

According to a first aspect of the present disclosure, a signal processing arrangement for a transmitter is provided. The signal processing arrangement comprises an in-phase modulator configured to receive an in-phase signal (I) and configured to modulate the in-phase signal (I), and a quadrature modulator configured to receive a quadrature signal (Q) and configured to modulate the quadrature signal (Q). The signal processing arrangement further comprises an in-phase demodulator configured to demodulate the modulated in-phase signal and to output a demodulated in-phase signal, and a quadrature demodulator configured to demodulate the modulated quadrature signal and to output a demodulated quadrature signal. The signal processing arrangement also comprises an in-phase harmonic filter configured to perform a filtering on harmonics in the demodulated in-phase signal and to output an in-phase digital signal, and a quadrature harmonic filter configured to perform a filtering on harmonics in the demodulated quadrature signal and to output a quadrature digital signal.

With a signal processing arrangement according to the disclosure the problem with modulation harmonics will be reduced as the filtration is more efficient with the configuration according to the disclosure.

In a first possible implementation form of a signal processing arrangement according to the first aspect, the in-phase modulator and the quadrature modulator are configured to perform pulse code modulation or pulse width modulation. The use of pulse code modulation or pulse width modulation is called flat noise modulation.

The use of pulse code modulation or pulse width modulation in the in-phase modulator and the quadrature modulator simplifies the circuit design and increases the possible processing speed in comparison with modulators configured to perform sigma-delta modulation.

Furthermore, the use of pulse code modulation or pulse width modulation in the in-phase modulator and the quadrature modulator improves the noise shaping performance in comparison with modulators configured to perform sigma-delta modulation.

This is especially true in the case of a second possible implementation form of a signal processing arrangement according to the first aspect or the first implementation form of the first aspect, wherein the in-phase modulator comprises cascaded in-phase modulator blocks, and the quadrature modulator comprises cascaded quadrature modulator blocks; wherein each one of the in-phase modulator blocks is configured to provide a resulting modulated in-phase signal to the in-phase demodulator, and each one of the quadrature modulator blocks is configured to provide a resulting modulated quadrature signal to the quadrature demodulator. The reason for this improvement is that even though the sigma-delta modulation can achieve better noise suppression at a first stage of cascaded in-phase modulator blocks and quadrature modulator blocks, the inter-stage gain ratio, i.e., the gain ratio between blocks, is smaller compared with pulse code modulation or pulse width modulation due to larger high frequency noise level. With two or three stages of cascaded/cascoded architecture the performance of pulse code modulation and pulse width modulation catches up so that pulse width modulation and pulse code modulation provides a better noise suppression. Also the attenuation of the modulation harmonics is high with the cascaded modulator blocks according to this aspect.

As for the cascaded modulator blocks, it means the modulation is not finished in one stage. Since pulse width modulation and pulse code modulation basically are quantization algorithms, the remains front a first stage modulator will be treated as un-used noise. In a cascaded pulse width algorithm or pulse code algorithm, after the first stage modulation, the remaining quantization value will be enlarged by an optimized ratio and being processed by a modulation algorithm again. The output of this second-stage modulation can be added back to the first-stage processed results by multiplying a weight and thus increase the effective resolution of the total output value. The second stage output residue signal may be further processed by the same process as the second stage did.

In a third possible implementation form of a signal processing arrangement according to the second possible implementation form the in-phase demodulator comprises in-phase demodulator blocks, wherein each in-phase demodulator block is connected to a corresponding in-phase modulator block, and the quadrature demodulator comprises quadrature demodulator blocks, wherein each quadrature demodulator blocks is connected to a corresponding quadrature modulator block. The configuration of the in-phase demodulator in in-phase demodulator blocks and the quadrature demodulator blocks in quadrature demodulator blocks provides for a relatively uncomplicated signal processing arrangement.

In a fourth possible implementation form of a signal processing arrangement according to the second or third possible implementation forms, at least one of the in-phase modulator blocks is configured as a pulse code modulator or a pulse width modulator, and/or at least one of the quadrature modulator blocks is configured as a pulse code modulator or a pulse width modulator. By using pulse code modulators or pulse width modulators in this way, the performance of the modulators may be optimized.

In a fifth possible implementation form of a signal processing arrangement according to the fourth possible implementation form, the last of the cascaded in-phase modulator blocks and/or the last of the cascaded quadrature modulator blocks is configured as a sigma-delta modulator. By having a different modulation for the last in-phase modulator block and/or the last quadrature modulator block, the small signal close band signal to noise ratio performance improved for the signal processing arrangement for some operational modes. Also, as the input signal of the last in-phase modulator block and/or the last quadrature modulator block will have a short input bit length its internal functional blocks can be simplified. This saves design area and increase processing speed.

In a sixth possible implementation form of a signal processing arrangement according to any one of the second to fifth possible implementation forms, each in-phase modulator block, except the last of the cascaded in-phase modulator blocks, is configured to provide an error signal between its input signal and its resulting modulated in-phase signal to the succeeding in-phase modulator block; and/or each quadrature modulator block, except the last of the cascaded quadrature modulator blocks, is configured to provide an error signal between its input signal and its resulting modulated quadrature signal to the succeeding quadrature modulator block. By such an arrangement of the in-phase modulator blocks, and/or the quadrature modulator blocks a flat noise shaping may be provided.

In a seventh possible implementation form of a signal processing arrangement according to the sixth possible implementation form, each in-phase modulator block, except the last of the cascaded in-phase modulator blocks, is configured to scale its error signal before providing it to the succeeding in-phase modulator block; and/or each quadrature modulator block, except the last of the cascaded quadrature modulator blocks, is configured to scale its error signal before providing it to the succeeding quadrature modulator block. By this feature the circuit design will be simplified.

In an eighth possible implementation form of a signal processing arrangement according to any one of the second to the seventh possible implementation forms, each in-phase modulator block is configured to output the resulting modulated in-phase signal $I_{SMn}$ calculable according to the following formula:

$$I_{SMn} = \frac{\text{Round}(I_{SSn} \cdot 0.5 \cdot k_n)}{0.5 \cdot k_n}$$

where $I_{SMn}$ is the resulting modulated in-phase signal from the n:th in-phase modulator block, $k_n$ is a predetermined n:th scale value, $I_{SSn}$ is the input signal to the n:th in-phase modulator block and Round means that the value is rounded to the nearest integer value; and/or each quadrature modulator block is configured to output the resulting modulated quadrature signal $Q_{SMn}$ calculable according to the following formula:

$$Q_{SMn} = \frac{\text{Round}(Q_{SSn} \cdot 0.5 \cdot k_n)}{0.5 \cdot k_n}$$

where $Q_{SMn}$ is the resulting modulated quadrature signal from the n:th quadrature modulator block, $k_n$ is a predetermined n:th scale value, $Q_{SSn}$ is the input signal to the n:th quadrature modulator block and Round means that the value is rounded to the nearest integer value.

A hardware realization of the in-phase modulator blocks and the quadrature modulator blocks will only have to perform add and subtract operations and no multiply operation. By such an arrangement a high modulation speed and a small circuit design area may be achieved. The inter-stage multipliers $k_1$-$k_4$ are preferably a power of 2 value. Such a choice simplifies the multiply operation into a bit shift operation.

A ninth possible implementation form of a signal processing arrangement according to any one of the second to the eighth possible implementation forms, further comprises a corresponding digital pre-distorter for each in-phase modulator block, wherein each digital pre-distorter is configured to compensate for non-linearity errors in the input signal to its corresponding in-phase modulator block; and/or a digital pre-distorter for each quadrature modulator block, wherein each digital pre-distorter is configured to compensate for non-linearity errors in the input signal to its corresponding quadrature modulator block.

The use of digital pre-distorters provides more tunability of the signal processing arrangement.

In a tenth possible implementation form of a signal processing arrangement according to the first aspect or to any one of the first to the ninth possible implementation forms, the in-phase harmonic filter comprises in-phase harmonic filter blocks, and the quadrature harmonic filter comprises quadrature harmonic filter blocks, wherein each in-phase harmonic filter block is connected to a corresponding in-phase demodulator block via a corresponding in-phase demodulator block, and each quadrature harmonic filter block is connected to a corresponding quadrature modulator block via a corresponding quadrature demodulator block.

In an eleventh possible implementation form of a signal processing arrangement according to the tenth possible implementation form of the first aspect, each in-phase harmonic filter block comprises an in-phase filter input configured to receive the demodulated in-phase signal and two-phase data shifters for processing of the demodulated in-phase signal, wherein each two-phase data shifter comprises a first phase data shifter and a second phase data shifter; and/or each quadrature harmonic filter block comprises a quadrature filter input configured to receive the demodulated quadrature signal and two-phase data shifters for processing of the demodulated in-phase signal, wherein each two-phase data shifter comprises a first phase data shifter and a second phase data shifter.

With the above arrangement of the in-phase harmonic filter block and the quadrature harmonic filter block an effective filtering on harmonics in the demodulated in-phase signal and on harmonics in the demodulated quadrature signal is achieved.

In a twelfth possible implementation form of a signal processing arrangement according to the eleventh possible implementation form of the first aspect the in-phase harmonic filter blocks and the quadrature harmonic filter blocks are configured to operate in at least a first mode; wherein in the first mode, in each in-phase harmonic filter block the two-phase data shifters are configured cascaded, and the first two-phase data shifter is configured to receive the demodulated in-phase signal from the in-phase filter input; and in each quadrature harmonic filter block the two-phase data shifters are configured cascaded and the first two-phase data shifter is configured to receive the demodulated quadrature signal from the quadrature filter input.

By the above configuration of the two-phase data shifters, the harmonic filter blocks provide an efficient filtration of the in-phase signal and the quadrature signal.

In a thirteenth possible implementation form of a signal processing arrangement according to the twelfth possible implementation form of the first aspect, in the first mode, the in-phase harmonic filter blocks and the quadrature harmonic filter blocks are configured to shift the demodulated in-phase signal from a first phase data shifter to the subsequent first phase data shifter based on a first reference clock signal and to shift data from a second phase data shifter to the subsequent second phase data shifter based on a second reference clock signal, wherein the first reference clock signal and the second reference clock signal both have the same frequency.

By having two-phase data shifters the noise is further reduced in comparison to having only single phase data shifters.

In a fourteenth possible implementation form of a signal processing arrangement according the twelfth or thirteenth possible implementation form of the first aspect the in-phase harmonic filter blocks and the quadrature harmonic filter blocks are configured to operate in also in a second mode; wherein in the second mode in each in-phase harmonic filter block the two-phase data shifters are configured in parallel and configured to receive the demodulated in-phase signal from the in-phase filter input, and in the quadrature harmonic filter blocks the two-phase data shifters are connected in parallel to the quadrature filter input.

This second mode is adapted for the case when no modulation harmonics are created.

A fifteenth possible implementation form of a signal processing arrangement according to the any possible implementation form of the first aspect or the first aspect as such comprises:

an up-conversion and mixing module connected to the in-phase harmonic filter and the quadrature harmonic filter, and configured to up-convert and mix the in-phase digital signal and the quadrature digital signal into an up-converted and mixed digital signal;

a serializer connected to the digital up-conversion and mixing module, and configured to serialize the up-converted and mixed digital signal into serialized digital signals;

a power amplifier for each one of the serialized digital signals, wherein each power amplifier is configured to power amplify a serialized digital signal and output the power amplified serialized digital signal.

By having a power amplifier for each one of the serialized digital signals the final combination, of the signal to be fed to an antenna, is performed after the power amplifiers. Also the final stage of the harmonic filtering is performed after the power amplifiers and a power combination network composed of switching capacitances. In this way the signal is kept digital as long as possible.

In a sixteenth possible implementation form of a signal processing arrangement according to the fifteenth possible implementation form of the first aspect the in-phase modulator and the quadrature modulator are configured to operate at a modulation frequency, and the serialized digital signals have a carrier frequency, wherein the in-phase harmonic filter and the quadrature harmonic filter are configured to operate in the first mode when the modulation frequency is different from the carrier frequency, and to operate in the second mode when the modulation frequency is equal to the carrier frequency. Thus, when the modulation frequency is equal to the carrier frequency, and no modulation harmonics are created, the in-phase harmonic filter and the quadrature harmonic filter are configured to operate in the second mode in which no filtration of harmonics occurs. When the modulation frequency is different from the carrier frequency, the in-phase harmonic filter and the quadrature harmonic filter are configured to operate in the first mode in which filtration of harmonics occurs.

Thus, it is possible to have the signal processing arrangement configured to operate in only the first mode. If the modulation frequency and the carrier frequency are controlled to always be different there is no need for the signal processing arrangement to be able to operate in the second mode.

A second aspect of the present disclosure relates to a signal processing method comprising:
receiving an in-phase signal (I) and modulating the in-phase signal (I);
receive a quadrature signal (Q) modulating the quadrature signal (Q);
demodulating the modulated in-phase signal (I) and outputting a demodulated in-phase signal (I);
demodulating the modulated quadrature (Q) and outputting a demodulated quadrature signal (Q);
performing a filtering on harmonics in the demodulated in-phase signal (I) and outputting an in-phase digital signal (I);
performing a filtering on harmonics in the demodulated quadrature signal (Q) and outputting a quadrature digital signal (Q).

The signal processing method may be supplemented by any of the features of the apparatuses described herein.

DETAILED DESCRIPTION

In the following description embodiments of the disclosure the same reference numerals will be used for the same features in the different drawings.

Figure 1:
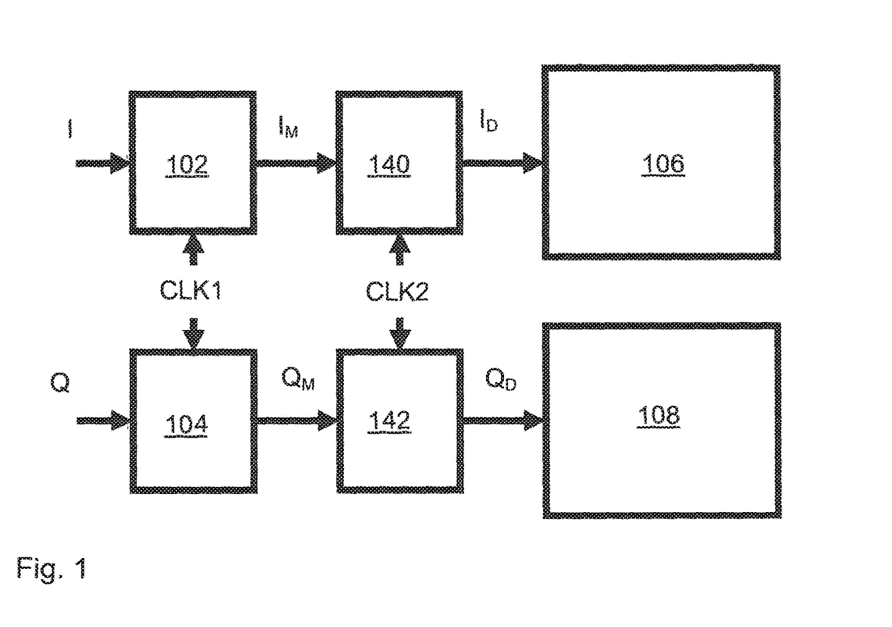
FIG. 1 shows schematically a signal processing arrangement for a transmitter according to an embodiment of the present disclosure.

FIG. 1 shows schematically a signal processing arrangement 100 for a transmitter (not shown in FIG. 1) according to an embodiment of the present disclosure. The signal processing arrangement 100 comprises an in-phase modulator 102 configured to receive an in-phase signal I and configured to modulate the in-phase signal I, and a quadrature modulator 104 configured to receive a quadrature signal Q and configured to modulate the quadrature signal Q. The signal processing arrangement 100 also comprises an in-phase demodulator 140 configured to demodulate the modulated in-phase signal $I_M$ and to output a demodulated in-phase signal $I_{DM}$, and a quadrature demodulator 142 configured to demodulate the modulated quadrature signal $Q_M$ and to output a demodulated quadrature signal $Q_{DM}$. Furthermore, the signal processing arrangement 100 comprises an in-phase harmonic filter 106 configured to perform a filtering on harmonics in the demodulated in-phase signal $I_{DM}$ and to output an in-phase digital signal $I_D$ and a quadrature harmonic filter 108 configured to perform a filtering on harmonics in the demodulated quadrature signal $Q_{DM}$ and to output a quadrature digital signal $Q_D$. Preferably, the in-phase modulator 102 and the quadrature modulator 104 are configured to perform pulse code modulation or pulse width modulation.

In operation, an in-phase signal I (e.g. derived from an IQ signal) is input to the in-phase modulator 102 and a quadrature signal Q (e.g. derived from the IQ signal and synchronised to the in-phase signal I) is input to the quadrature modulator 104. The in-phase signal I and the quadrature signal Q are e.g. at least 12 bit digital signals. The in-phase modulator 102 modulates the in-phase signal I and outputs a modulated in-phase signal $I_M$ to the in-phase demodulator

140. The quadrature modulator 104 modulates the quadrature signal Q and outputs a modulated quadrature signal $Q_M$ to the quadrature demodulator 142. The in-phase demodulator 140 demodulates the modulated in-phase signal and outputs a demodulated in-phase signal $I_{DM}$ to the in-phase harmonic filter 106. The in-phase harmonic filter 106 performs a filtering on harmonics in the demodulated in-phase signal $I_{DM}$ and outputs an in-phase digital signal $I_D$. The quadrature demodulator 142 demodulates the modulated quadrature signal and outputs a demodulated quadrature signal $Q_{DM}$ to the quadrature harmonic filter 108. The quadrature harmonic filter 108 performs a filtering on harmonics in the demodulated quadrature signal $Q_{DM}$ and outputs a quadrature digital signal $Q_D$.

Figure 2:
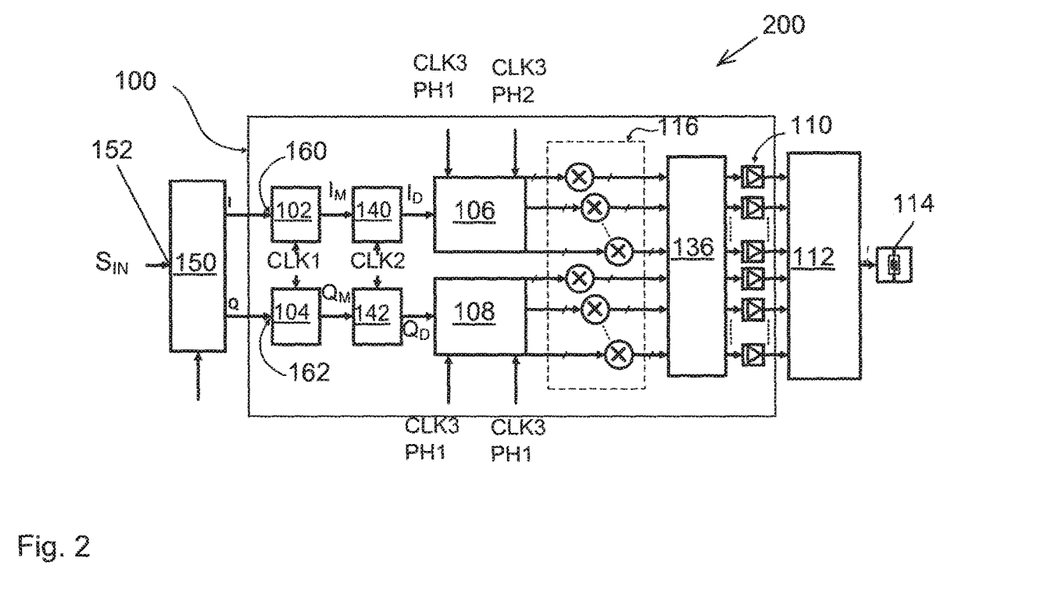
FIG. 2 shows schematically a transmitter comprising a signal processing arrangement according to a second embodiment of the present disclosure.

FIG. 2 shows schematically a transmitter 200 comprising a signal processing arrangement 100 according to an embodiment of the present disclosure. Only the differences between the signal processing arrangement 100 of FIG. 1 and the signal processing arrangement 100 of FIG. 2 will be described. The transmitter 200 comprises a digital up-sampling device 150 comprising an input 152. The digital up-sampling device 150 does not form part of the signal processing arrangement 100. The digital up-sampling device 150 is configured to receive a digital input signal $S_{IN}$ on the input 152 and to up-sample and transform the digital input signal into an in-phase signal I and a quadrature signal Q. The in-phase signal I and the quadrature signal Q are inputs to the in-phase modulator 102 and the quadrature modulator 104 as has been described in connection with FIG. 1 above. Also the in-phase demodulator 140, the quadrature demodulator 142, the in-phase harmonic filter 106 and the quadrature harmonic filter 108 have been described in connection with FIG. 1.

The signal processing arrangement 100 also comprises an up-conversion and mixing module 116 connected to the in-phase harmonic filter 106 and the quadrature harmonic filter 108. The up-conversion and mixing module 116 is configured to up-convert and mix the in-phase digital signal and the quadrature digital signal into an up-converted and mixed digital signal. The signal processing arrangement 100 also comprises a serializer 136 connected to the digital up-conversion and mixing module 116, and configured to serialize the up-converted and mixed digital signal into serialized digital signals. Furthermore, the signal processing arrangement 100 comprises a power amplifier 110 for each one of the serialized digital signals. Each power amplifier 110 is configured to power amplify a serialized digital signal and output the power amplified serialized digital signal. The signal processing arrangement 100 may be manufactured as an integrated circuit. The transmitter 200 comprises the above described digital up-sampling device 150. The transmitter 200 also comprises a power combination filter 112 which combines the power amplified serialized digital signals into a combined output signal which is output to a load in the form of an antenna 114. The power combination filter 112 may be realized in a large number of ways and its function is to combine the power amplified serialized digital signals from the power amplifiers 110.

The digital up-sampling device 150 is driven by a first clock signal CLK1. Also the in-phase modulator 102 and the quadrature modulator 104 are driven by the first clock signal CLK1. The frequency of the first clock signal CLK1 is called the modulation frequency $f_s$. The in-phase demodulator 140 and the quadrature demodulator 142 are driven by a second clock signal CLK2. The first clock signal CLK1 is equal to the second clock signal CLK2. I.e. the have the same frequency and phase. The in-phase harmonic filter 106 and the quadrature harmonic filter 108, are driven by a third clock signal CLK3 of a first phase PH1 and a second phase PH2. The frequency of the third clock signal CLK3 is called the carrier frequency $f_c$. Depending on the working mode the carrier frequency $f_c$ may be equal to or different from the modulation frequency $f_s$. The serializer 136 is driven by a fourth clock signal CLK4 having a frequency of 2 times the carrier frequency $f_c$.

The final signal processing steps are performed in the power combination filter 112. The in-phase harmonic filter 106 is configured to realize a part of the signal processing steps necessary for filtering out modulation harmonics in the demodulated in-phase signal I. Correspondingly, the quadrature harmonic filter 108 is configured to realize a part of the signal processing steps necessary for filtering out modulation harmonics in the demodulated quadrature phase signal Q. The remainder of the steps necessary for filtering out modulation harmonics in the demodulated in-phase signal and in the demodulated quadrature signal Q are performed in the power combination filter 112 after the up-conversion and mixing module 116, and after the serializer 136. An antenna 114 is connected to the power combination filter 112.

Figure 3:
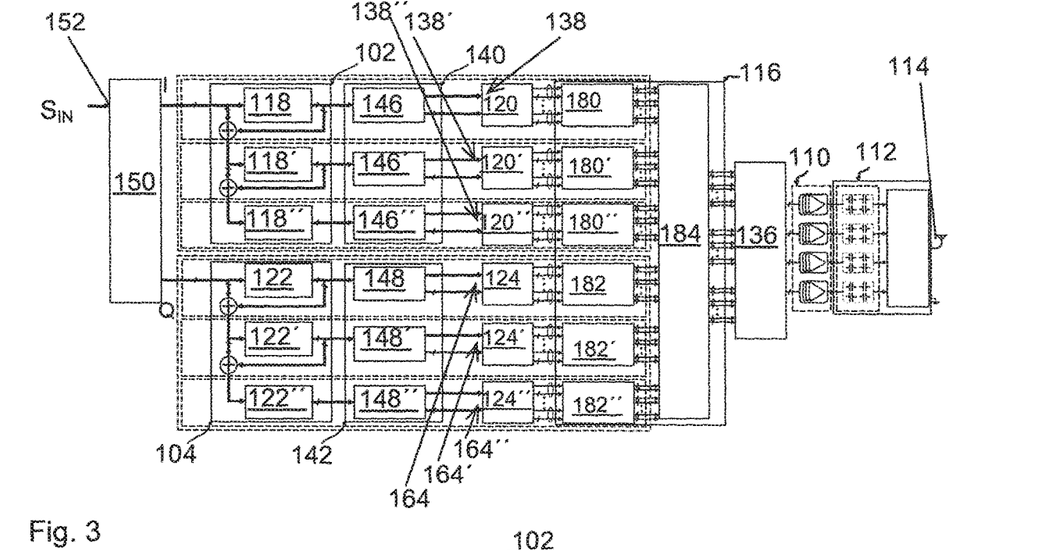
FIG. 3 shows schematically in more detail the transmitter in FIG. 2.

FIG. 3 shows schematically in more detail the transmitter in FIG. 2. As can be seen in FIG. 3 the in-phase modulator 102 comprises cascaded in-phase modulator blocks 118, 118', 118", and the quadrature modulator 104 comprises cascaded quadrature modulator blocks 122, 122', 122". Furthermore, the in-phase demodulator 140 comprises in-phase demodulator blocks 146, 146', 146" and the quadrature demodulator 142 comprises quadrature demodulator blocks 148, 148', 148". Each in-phase demodulator block 146, 146', 146", is connected to a corresponding in-phase modulator block 118, 118', 118", and each quadrature demodulator blocks 148, 148', 148", is connected to a corresponding quadrature modulator block 122, 122', 122". Each one of the in-phase modulator blocks 118, 118', 118", is configured to provide a resulting modulated in-phase signal to the corresponding in-phase demodulator block 146, 146', 146" and each one of the quadrature modulator blocks 122, 122', 122" is configured to provide a resulting modulated quadrature signal to the corresponding quadrature demodulator block 148, 148', 148".

The first and the second of the in-phase modulator blocks 118, 118', are configured as a pulse code modulator or a pulse width modulator. Correspondingly, the first and the second of the quadrature modulator blocks 122, 122', 122", are configured as a pulse code modulator or a pulse width modulator. The last of the cascaded in-phase modulator blocks 118", and the last of the cascaded quadrature modulator blocks 122" are configured as a sigma-delta modulator. Alternatively, both of the last of the cascaded modulator blocks 118" and 122" could be configured as a pulse width modulator PWM or a pulse code modulator PCM. Each in-phase modulator block 118, 118', except the last of the cascaded in-phase modulator blocks, is configured to provide an error signal between its input signal and its resulting modulated in-phase signal to the succeeding in-phase modulator block 118', 118". Each quadrature modulator block 122, 122', except the last of the cascaded quadrature modulator blocks, is configured to provide an error signal between its input signal and its resulting modulated quadrature signal to the succeeding quadrature modulator block 122', 122". Furthermore, each in-phase modulator block, except the last of the cascaded in-phase modulator blocks, is configured to scale its error signal before providing it to the succeeding in-phase modulator block, and each quadrature modulator block, except the last of the cascaded quadrature modulator blocks, is configured to scale its error signal before providing it to the succeeding quadrature modulator block. Thus, the modulation in the in-phase modulator 102 is as follows from the description of FIG. 4 below.

Furthermore, the in-phase harmonic filter 106 comprises in-phase harmonic filter blocks 120, 120', 120'', and the quadrature harmonic filter 108 comprises quadrature harmonic filter blocks 124, 124', 124'', wherein each in-phase harmonic filter block 120, 120', 120'' is connected to a corresponding in-phase modulator block 118, 118', 118'' via a corresponding in-phase demodulator block 146, 146', 146'', and each quadrature harmonic filter block 124, 124', 124'' is connected to a corresponding quadrature modulator block 122, 122', 122'' via a corresponding quadrature demodulator block 148, 148', 148''. The in-phase harmonic filter blocks 120, 120', 120'', and the quadrature harmonic filter blocks 124, 124', 124'', will be described in more detail below with reference to FIG. 5.

As is also shown in FIG. 3 the up-conversion and mixing module 116 comprises an in-phase up-conversion block 180, 180', 180'', for each in-phase harmonic filter block 146, 146', 146'', and a quadrature up-conversion block 182, 182', 182'', for each quadrature harmonic filter block 148, 148', 148''. The in-phase up-conversion blocks 180, 180', 180'', and the quadrature up-conversion blocks 182, 182', 182'' up-convert the filtered signals from the in-phase harmonic filter blocks 146, 146', 146'', and the quadrature harmonic filter blocks 148, 148', 148''. A mixer 184 is connected to the in-phase up-conversion blocks 180, 180', 180'', and the quadrature up-conversion blocks 182, 182', 182''. The mixer 184 performs mixing of the different signal from the in-phase up-conversion blocks 180, 180', 180'', and the quadrature up-conversion blocks 182, 182', 182''. The mixer is connected to a serializer 136, a power combination filter 112, and an antenna 114 as has been described in FIG. 2.

Figure 4:
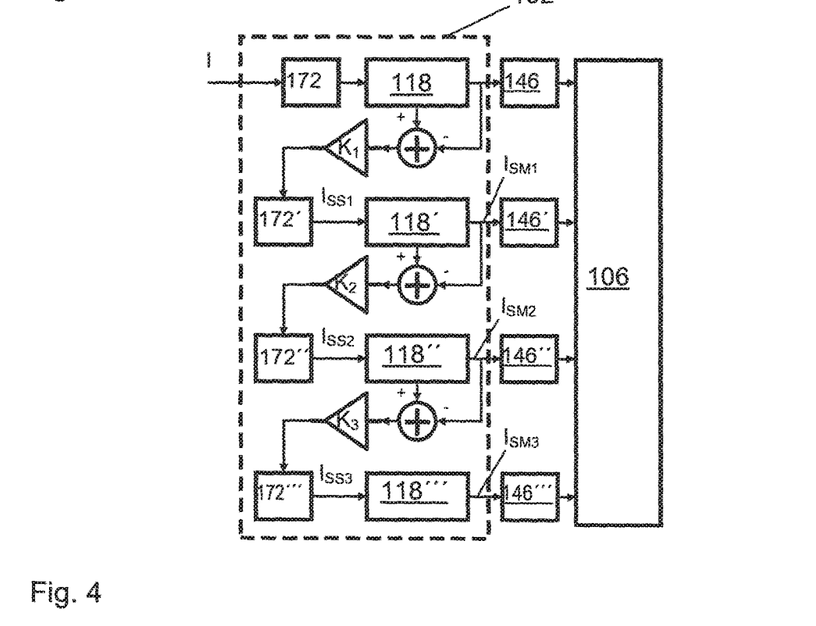
FIG. 4 shows in more detail the in-phase digital harmonic filter and the quadrature digital harmonic filter of the signal processing arrangement in FIG. 1, FIG. 2 and FIG. 3.

FIG. 4 shows in more detail the in-phase modulator with cascaded in-phase modulator blocks. The in-phase signal I is input to the in-phase modulator 102. As can be seen in FIG. 4 the in-phase modulator 102 comprises four cascaded in-phase modulator blocks 118, 118', 118'', 118'''. The in-phase modulator also comprises a corresponding digital pre-distorter 172, 172', 172'', 172''', for each in-phase modulator block, wherein each digital pre-distorter 172, 172', 172'', 172''', is configured to compensate for non-linearity errors in the input signal to its corresponding in-phase modulator block 118, 118', 118'', 118'''. This requires knowledge on the non-linearity errors in the input signal. The quadrature modulator block is configured in a corresponding way and will not be described in detail herein. Each in-phase modulator block 118, 118', 118'', 118''', is configured to output a resulting modulated in-phase signal $I_{SMn}$ calculable according to the following formula:

$$I_{SMn} = \frac{\text{Round } (I_{SSn} \cdot 0.5 \cdot k_n)}{0.5 \cdot k_n}$$

where $I_{SMn}$ is the resulting modulated in-phase signal from the n:th in-phase modulator block 118, 118', 118'', $k_n$ is a predetermined n:th scale value, $I_{SSn}$ is the input signal to the n:th in-phase modulator block and Round means that the value is rounded to the nearest integer value. Furthermore, the n:th in-phase modulator block 118, 118', 118'', except the last in-phase modulator block 118''' is configured to calculate the input signal $I_{SSn+1}$ to the following in-phase modulator block 118', 118'', 118''' according to the following formula:

$$I_{SSn+1} = (I_{SSn} - I_{SMn}) \cdot k_n.$$

As mentioned above the quadrature modulator is configured in the corresponding way. As an example we assume that the input signal I is 0.3 and that all $k_n$ are equal to 8. This means that the first modulated in-phase signal ISM1 from the first in-phase modulator block 118 is equal to:

$$I_{SMn} = \frac{\text{Round } (0.3 \cdot 0.5 \cdot 8)}{0.5 \cdot 8}$$

i.e., $I_{SM1}$=0.25. Furthermore, the second input signal $I_{SS2}$ to the second modulator block is (0.3−0.25)·8=0.4.

Figure 5:
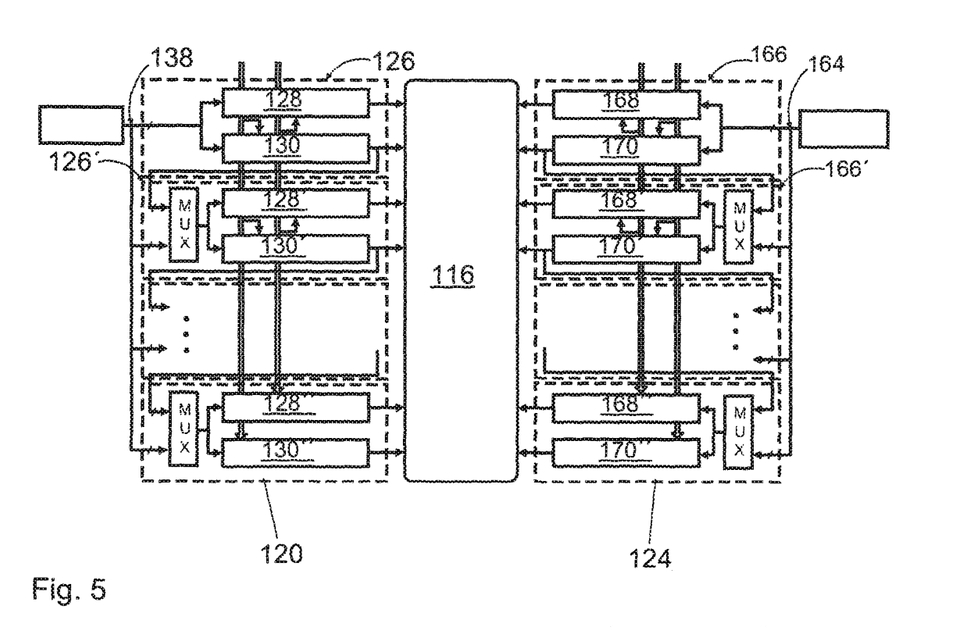
FIG. 5 shows in more detail the first in-phase harmonic filter block and the first quadrature harmonic filter block in the transmitter in FIG. 3.

FIG. 5 shows in more detail the first in-phase harmonic filter block 120. Each in-phase harmonic filter block 120, 120', 120'', comprises an in-phase filter input 138, 138', 138'', (FIG. 3), configured to receive the demodulated in-phase signal. In FIG. 5 only the first in-phase harmonic filter block 120 is shown. The other in-phase harmonic filter blocks have the same layout. The first in-phase harmonic filter block 120 shown in FIG. 5 comprises two-phase data shifters 126, 126', 126'', for processing of the demodulated in-phase signal. Each two-phase data shifter 126, 126', 126'', comprises a first phase data shifter 128, 128', 128'', and a second phase data shifter 130, 130', 130''. Correspondingly, each quadrature harmonic filter block 124, 124', 124'', comprises a quadrature filter input 164, 164', 164'' configured to receive the demodulated quadrature signal. In FIG. 5 only the first quadrature harmonic filter block 124 is shown. The first quadrature harmonic filter block 124 comprises two-phase data shifters for processing of the demodulated in-phase signal. Each two-phase data shifter 166, 166', 166'', comprises a first phase data shifter 168, 168', 168'', and a second phase data shifter 170, 170', 170''. A separate multiplexer unit MUX is arranged between the in-phase filter input 138 and each two-phase data shifter 126', 126'' except the first two-phase data shifter 126, 126', 126''. Each multiplexer unit MUX is also arranged between a two-phase data shifter and the previous two-phase data shifter 126', 126'', and a previous two-phase data shifter 126, 126'. A separate multiplexer unit MUX' is arranged between the quadrature filter input 164 and each two-phase data shifter 166', 166'' except the first two-phase data shifter 166. Each multiplexer unit MUX' is also arranged between a two-phase data shifter 166', 166'' and a previous two-phase data shifter 166, 166'.

The in-phase harmonic filter blocks 120, 120', 120'', and the quadrature harmonic filter blocks 124, 124', 124'', are configured to operate in at least a first mode. In the first mode, two-phase data shifters 126, 126', 126'' of the first in-phase harmonic filter blocks 120, are configured cascaded, and the first two-phase data shifter 126 is configured to receive the demodulated in-phase signal from the in-phase filter input 138. The multiplexer units MUX are configured to connect the data shifters 126, 126', 126'', to provide the data shifter cascaded in this first mode. Thus, the in-phase filter input 138 is connected only to the first two-phase data shifter 126 in this first mode. The other in-phase harmonic filter blocks 120', 120'' (FIG. 3) are configured in the same way. In the first mode the two-phase data shifters 166, 166', 166'' of the first quadrature harmonic filter block 124, 124', 124'', are configured cascaded and the first two-phase data shifter 166 is configured to receive the demodulated quadrature signal from the quadrature filter input 164. The other quadrature harmonic filter blocks 124', 124" (FIG. 3), are configured in the same way.

In the first mode, the in-phase harmonic filter blocks 120, 120', 120", and the quadrature harmonic filter blocks 124, 124', 124", are configured to shift the demodulated in-phase signal from a first phase data shifter 126, 126'; 168, 168', to the subsequent first phase data shifter 126', 126"; 168', 168", based on a first reference clock signal CLK3 PH1, and to shift data from a second phase data shifter 130, 130'; 170, 170', to the subsequent second phase data shifter 130', 130"; 170', 170", based on a second reference clock signal CLK3 PH2, wherein the first reference clock signal CLK3 PH1 and the second reference clock signal CLK3 PH2 both have the same frequency.

In the embodiment described with reference to FIG. 5, the in-phase harmonic filter blocks 120, 120', 120", and the quadrature harmonic filter blocks 124, 124', 124", are configured to operate also in a second mode. This second mode is optional. In the second mode, in each in-phase harmonic filter block 120, 120', 120", the two-phase data shifters 126, 126', 126", are configured in parallel and configured to receive the demodulated in-phase signal from the in-phase filter input 138, and, in the quadrature harmonic filter blocks 124, 124', 124", the two-phase data shifters 166, 166', 166", are connected in parallel to the quadrature filter input 164. This is achieved by the multiplexer units MUX being configured to connect the in-phase filter input 138 with each one of the two-phase data shifters 126, 126', 126".

Figure 6:
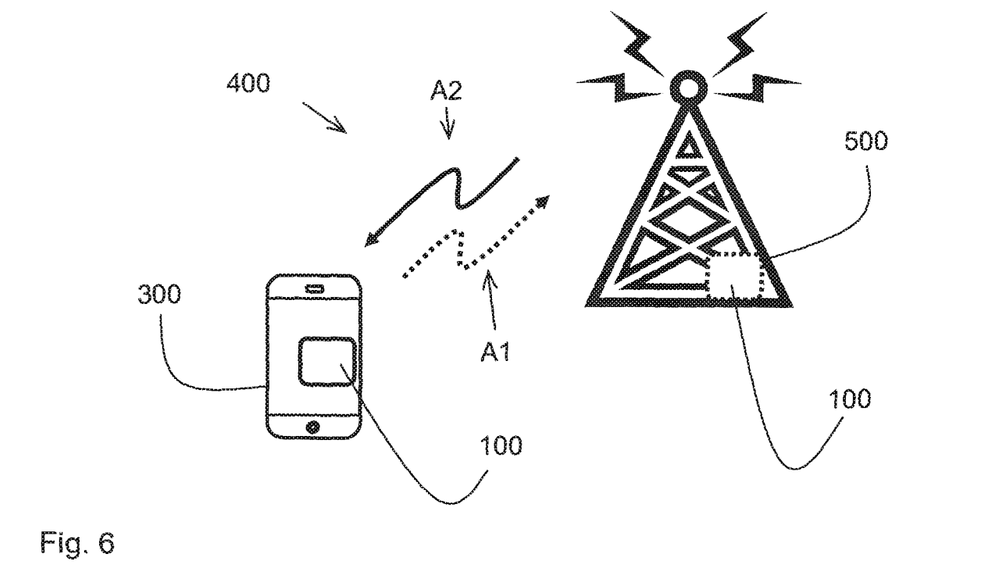
FIG. 6 shows schematically a transmitter device in a wireless communication system which transmitter device comprises a signal processing arrangement according to FIG. 2.

FIG. 6 shows schematically a transmitter device 300 in a wireless communication system 400. The transmitter device 300 comprises a transmitter 100 according to FIG. 2 or FIG. 3. The wireless communication system 400 also comprises a base station 500 which may also comprise a quadrature digital power amplifier system 100 according to any one of the embodiments described above. The dotted arrow A1 represents transmissions from the transmitter device 300 to the base station 500, which are usually called up-link transmissions. The full arrow A2 represents transmissions from the base station 500 to the transmitter device 300, which are usually called down-link transmissions.

The present transmitter device 300 may be any of a User Equipment (UE) in Long Term Evolution (LTE), mobile station (MS), wireless terminal or mobile terminal which is enabled to communicate wirelessly in a wireless communication system, sometimes also referred to as a cellular radio system. The UE may further be referred to as mobile telephones, cellular telephones, computer tablets or laptops with wireless capability. The UEs in the present context may be, for example, portable, pocket-storable, hand-held, computer-comprised, or vehicle-mounted mobile devices, enabled to communicate voice or data, via the radio access network, with another entity, such as another receiver or a server. The UE can be a Station (STA), which is any device that contains an IEEE 802.11-conformant Media Access Control (MAC) and Physical Layer (PHY) interface to the Wireless Medium (WM).

The present transmitter device 300 may also be a base station a (radio) network node or an access node or an access point or a base station, e.g., a Radio Base Station (RBS), which in some networks may be referred to as transmitter, "eNB", "eNodeB", "NodeB" or "B node", depending on the technology and terminology used. The radio network nodes may be of different classes such as, e.g., macro eNodeB, home eNodeB or pica base station, based on transmission power and thereby also cell size. The radio network node can be a Station (STA), which is any device that contains an IEEE 802.11-conformant Media Access Control (MAC) and Physical Layer (PHY) interface to the Wireless Medium (WM).

The invention claimed is:

1. A signal processing apparatus for a transmitter, the signal processing apparatus comprising:
   an in-phase modulator configured to receive an in-phase signal (I) and configured to modulate the in-phase signal (I) to generate a modulated in-phase signal (I);
   a quadrature modulator configured to receive a quadrature signal (Q) and configured to modulate the quadrature signal (Q) to generate a modulated quadrature signal (Q);
   an in-phase demodulator coupled to the in-phase modulator and configured to:
      receive the modulated in-phase signal (I) from the in-phase modulator;
      demodulate the modulated in-phase signal (I) received from the in-phase modulator; and
      output a demodulated in-phase signal (I);
   a quadrature demodulator coupled to the quadrature modulator and configured to:
      receive the modulated quadrature signal (Q) from the quadrature modulator;
      demodulate the modulated quadrature signal (Q); and
      output a demodulated quadrature signal (Q);
   an in-phase harmonic filter coupled to the in-phase demodulator and comprising in-phase harmonic filters, wherein each of the in-phase harmonic filters is coupled to a corresponding in-phase demodulator, and wherein each of the in-phase harmonic filters is configured to perform filtering on harmonics in the demodulated in-phase signal (I) and to output a resulting in-phase digital signal (I);
   a quadrature harmonic filter coupled to the quadrature demodulator and comprising quadrature harmonic filters, wherein each of the quadrature harmonic filters is coupled to a corresponding quadrature demodulator, and wherein each of the quadrature harmonic filters is configured to perform filtering on harmonics in the demodulated quadrature signal (Q) and to output a resulting quadrature digital signal (Q).

2. The signal processing apparatus of claim 1, wherein the in-phase modulator and the quadrature modulator are configured to perform pulse code modulation or pulse width modulation.

3. The signal processing apparatus of claim 1, wherein the in-phase modulator comprises cascaded in-phase modulators, wherein the quadrature modulator comprises cascaded quadrature modulators, wherein each of the cascaded in-phase modulators is configured to provide a resulting modulated in-phase signal to the in-phase demodulator, and wherein each of the cascaded quadrature modulators is configured to provide a resulting modulated quadrature signal to the quadrature demodulator.

4. The signal processing apparatus of claim 3, wherein the in-phase demodulator comprises in-phase demodulators, wherein each of the in-phase demodulators is coupled to a corresponding in-phase modulator, wherein the quadrature demodulator comprises quadrature demodulators, and wherein each of the quadrature demodulators is coupled to a corresponding quadrature modulator.

5. The signal processing apparatus of claim 3, wherein at least one of the cascaded in-phase modulators is configured as a first pulse code modulator or a first pulse width modulator, and wherein at least one of the cascaded quadrature modulators is configured as a second pulse code modulator or a second pulse width modulator.

6. The signal processing apparatus of claim 5, wherein a last of the cascaded in-phase modulators and a last of the cascaded quadrature modulators are each configured as a sigma-delta modulator.

7. The signal processing apparatus of claim 3, wherein each cascaded in-phase modulator except a last of the cascaded in-phase modulators is configured to provide an in-phase error signal between an input signal and a resulting modulated in-phase signal to a succeeding cascaded in-phase modulator, and wherein each cascaded quadrature modulator except a last of the cascaded quadrature modulators, is configured to provide a quadrature error signal between an input signal and a resulting modulated quadrature signal to a succeeding cascaded quadrature modulator.

8. The signal processing apparatus of claim 7, wherein each cascaded in-phase modulator except the last of the cascaded in-phase modulators is configured to scale the in-phase error signal before providing the in-phase error signal to the succeeding cascaded in-phase modulator, and wherein each cascaded quadrature modulator except the last of the cascaded quadrature modulators is configured to scale the quadrature error signal before providing the quadrature error signal to the succeeding cascaded quadrature modulator.

9. The signal processing apparatus of claim 3, wherein the resulting modulated in-phase signal is a resulting modulated in-phase signal $I_{SMn}$ according to the following formula:

$$I_{SMn} = \frac{\text{Round}(I_{SSn} \cdot 0.5 \cdot k_n)}{0.5 \cdot k_n}$$

where $I_{SMn}$ is the resulting modulated in-phase signal from an n:th cascaded in-phase modulator, $k_n$ is a predetermined n:th scale value, $I_{SSn}$ is an input signal to the n:th cascaded in-phase modulator and Round means rounding to a nearest integer value, and wherein the resulting modulated quadrature signal is a resulting modulated quadrature signal $Q_{SMn}$ according to the following formula:

$$Q_{SMn} = \frac{\text{Round}(Q_{SSn} \cdot 0.5 \cdot k_n)}{0.5 \cdot k_n}$$

where $Q_{SMn}$ is the resulting modulated quadrature signal from the n :th cascaded quadrature modulator, $k_n$ is a predetermined n:th scale value, $Q_{SSn}$ is the input signal to the n:th cascaded quadrature modulator and Round means rounding to the nearest integer value.

10. The signal processing apparatus of claim 3, further comprising:
a corresponding digital pre-distorter coupled to a corresponding in-phase modulator, wherein each digital pre-distorter is configured to compensate for non-linearity errors in an input signal to its corresponding in-phase modulator; and
a digital pre-distorter coupled to a corresponding quadrature modulator, wherein each digital pre-distorter is configured to compensate for non-linearity errors in the input signal to its corresponding quadrature modulator.

11. The signal processing apparatus of claim 1, wherein each of the in-phase harmonic filters comprises an in-phase filter input configured to receive the demodulated in-phase signal and first two-phase data shifters for processing of the demodulated in-phase signal, wherein each of the first two-phase data shifters comprises a first phase data shifter and a second phase data shifter, wherein each quadrature harmonic filter block comprises a quadrature filter input configured to receive the demodulated quadrature signal and second two-phase data shifters for processing of the demodulated in-phase signal, and wherein each of the second two-phase data shifters comprises a first phase data shifter and a second phase data shifter.

12. The signal processing apparatus of claim 11, wherein the in-phase harmonic filters and the quadrature harmonic filters are configured to operate in at least a first mode, wherein in the first mode:
in each of the in-phase harmonic filters, the first two-phase data shifters of the in-phase harmonic filter are cascaded, and the first two-phase data shifters of the in-phase harmonic filter are configured to receive the demodulated in-phase signal from the in-phase filter input; and
in each of the quadrature harmonic filters, the second two-phase data shifters of the quadrature harmonic filter are cascaded, and the first two-phase data shifters of the quadrature harmonic filter are configured to receive the demodulated quadrature signal from the quadrature filter input.

13. The signal processing apparatus of claim 12, wherein in the first mode, the in-phase harmonic filters and the quadrature harmonic filters are configured to shift the demodulated in-phase signal from a first phase data shifter to a subsequent first phase data shifter based on a first reference clock signal (CLK1) and to shift data from a second phase data shifter to a subsequent second phase data shifter based on a second reference clock signal (CLK2), and wherein the first reference clock signal (CLK1) and the second reference clock signal (CLK2) both have a same frequency.

14. The signal processing apparatus of claim 12, wherein the in-phase harmonic filters and the quadrature harmonic filters are further configured to operate in a second mode, wherein in the second mode:
in each of the in-phase harmonic filters, the first two-phase data shifters of the in-phase harmonic filter are configured in parallel and configured to receive the demodulated in-phase signal from the in-phase filter input; and
in each of the quadrature harmonic filters, the first two-phase data shifters are coupled in parallel to the quadrature filter input.

15. The signal processing apparatus of claim 1, further comprising:
an up-converter and mixer coupled to the in-phase harmonic filter and the quadrature harmonic filter, wherein the up-converter and mixer is configured to up-convert and mix the in-phase digital signal and the quadrature digital signal into an up-converted and mixed digital signal;
a serializer coupled to the up-converter and mixer, wherein the serializer is configured to serialize the up-converted and mixed digital signal into serialized digital signals; and
a power amplifier for each of the serialized digital signals, wherein each power amplifier is configured to power amplify a serialized digital signal and output a power amplified serialized digital signal.

16. The signal processing apparatus of claim 15, wherein the in-phase harmonic filters and the quadrature harmonic filters are configured to operate in at least a first mode and a second mode, wherein the in-phase modulator and the quadrature modulator are configured to operate at a modulation frequency ($f_s$), wherein the serialized digital signals have a carrier frequency ($f_c$), wherein the in-phase harmonic filter and the quadrature harmonic filter are configured to operate in the first mode when the modulation frequency ($f_s$) is equal to the carrier frequency ($f_c$), and wherein the in-phase harmonic filter and the quadrature harmonic filter are configured to operate in the second mode when the modulation frequency ($f_s$) is different from the carrier frequency ($f_c$).

17. The signal processing apparatus of claim 1, wherein the in-phase modulator, the quadrature modulator, the in-phase demodulator, the quadrature demodulator, the in-phase harmonic filter, and the quadrature harmonic filter are transmission components.

18. A signal processing method, comprising:
receiving, by an in-phase modulator, an in-phase signal (I);
modulating, by the in-phase modulator, the in-phase signal (I);
receiving, by a quadrature modulator, a quadrature signal (Q);
modulating, by the quadrature modulator, the quadrature signal (Q);
receiving, by an in-phase demodulator from the in-phase modulator, a modulated in-phase signal (I);
demodulating, by the in-phase demodulator, the modulated in-phase signal (I);
outputting, by the in-phase demodulator, a demodulated in-phase signal (I);
receiving, by a quadrature demodulator from the quadrature modulator, a modulated quadrature signal (Q);
demodulating, by the quadrature demodulator, the modulated quadrature signal (Q);
outputting, by the quadrature demodulator, a demodulated quadrature signal (Q);
performing, by an in-phase harmonic filter comprising in-phase harmonic filters, filtering on harmonics in the demodulated in-phase signal (I), wherein each of the in-phase harmonic filters is coupled to a corresponding in-phase demodulator;
outputting a resulting in-phase digital signal (I) based on performing the filtering on harmonics in the demodulated in-phase signal (I);
performing, by a quadrature harmonic filer comprising quadrature harmonic filters, filtering on harmonics in the demodulated quadrature signal (Q), wherein each of the quadrature harmonic filters is coupled to a corresponding quadrature demodulator; and
outputting a resulting quadrature digital signal (Q) based on performing the filtering on harmonics in the demodulated quadrature signal (Q).

19. The method of claim 18, wherein the in-phase modulator comprises cascaded in-phase modulators, wherein the quadrature modulator comprises cascaded quadrature modulators, and wherein the method further comprises:
providing, by each of the cascaded in-phase modulators, a resulting modulated in-phase signal to the in-phase demodulator; and
providing, by each of the cascaded quadrature modulators, a resulting modulated quadrature signal to the quadrature demodulator.

20. The method of claim 18, further comprising performing, by each of the in-phase modulator and the quadrature modulator, pulse code modulation or pulse width modulation.

* * * * *

UNITED STATES PATENT AND TRADEMARK OFFICE
CERTIFICATE OF CORRECTION

PATENT NO. : 10,516,424 B2  
APPLICATION NO. : 15/909520  
DATED : December 24, 2019  
INVENTOR(S) : Liang Rong et al.

Page 1 of 1

It is certified that error appears in the above-identified patent and that said Letters Patent is hereby corrected as shown below:

On the Title Page

References Cited, U.S. Patent Documents, Second listing: "6,594,309 B1 7/2003 Grosso et al." should read "6,594,309 B1 7/2003 Botti et al."

In the Claims

Claim 9, Column 15, Line 33: "Round($I_{SSn}$ * 0.5 * $k_n$)" should read "*Round*($I_{SSn} \cdot 0,5 \cdot k_n$)"

Claim 9, Column 15, Line 45: "Round($I_{SSn}$ * 0.5 * $k_n$)" should read "*Round*($I_{SSn} \cdot 0,5 \cdot k_n$)"

Claim 9, Column 15, Line 49: "n :th" should read "n:th"

Signed and Sealed this  
Eleventh Day of February, 2020

Andrei Iancu  
*Director of the United States Patent and Trademark Office*